(12) United States Patent
Moon et al.

(10) Patent No.: US 6,522,411 B1
(45) Date of Patent: Feb. 18, 2003

(54) OPTICAL GAP MEASURING APPARATUS AND METHOD HAVING TWO-DIMENSIONAL GRATING MARK WITH CHIRP IN ONE DIRECTION

(75) Inventors: Euclid E. Moon, Boston, MA (US); Patrick N. Everett, Concord, MA (US); Henry I. Smith, Sudbury, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 09/578,578

(22) Filed: May 25, 2000

Related U.S. Application Data

(60) Provisional application No. 60/135,874, filed on May 25, 1999.

(51) Int. Cl.[7] .................................................. G01B 9/02
(52) U.S. Cl. ...................................................... 356/505
(58) Field of Search ................................. 356/505, 506, 356/498, 496, 492, 485, 521

(56) References Cited

U.S. PATENT DOCUMENTS

| | | | |
|---|---|---|---|
| 5,343,292 A | | 8/1994 | Brueck et al. |
| 5,355,219 A | * | 10/1994 | Araki et al. ................ 356/490 |
| 5,414,514 A | | 5/1995 | Smith et al. |
| 5,808,742 A | | 9/1998 | Everett et al. |

FOREIGN PATENT DOCUMENTS

| | | | |
|---|---|---|---|
| GB | 2 183 364 A | | 6/1987 |
| JP | 402017401 | * | 1/1990 |

* cited by examiner

*Primary Examiner*—Samuel A. Turner
(74) *Attorney, Agent, or Firm*—Samuels, Gauthier & Stevens, LLP

(57) ABSTRACT

An apparatus and method of measuring the gap between one substantially planar object, such as a mask, and a second planar object, such as a substrate. The invention achieves a high degree of sensitivity, accuracy, capture range, and reliability, through a novel design of a mark located only on the mask-plate. The light is inclined to the surfaces so associated optical components do not interrupt the exposing beam used in lithography. The same optics are used as for aligning overlay. Each gapping mark on the mask-plate includes one or more two-dimensional gratings, each with period constant in the incident plane, but varying in the transverse plane. When illuminated, two images are formed of each of the two-dimensional gratings, with fringes resulting from interference between paths having traveled different distances through the gap and the mask-plate as a result of successive diffractions and reflections. Phase and geometric measurements from these images yield accurate measurement of the gap between the plates. Direct calibration, referenced to the light-wavelength, is obtained from a diffractive Michelson technique that uses a linear grating also included within the gapping mark.

17 Claims, 10 Drawing Sheets

OPTICAL GAP MEASURING APPARATUS AND METHOD HAVING TWO-DIMENSIONAL GRATING MARK WITH CHIRP IN ONE DIRECTION

PRIORITY INFORMATION

This application claims priority from provisional application Ser. No. 60/135,874 filed May 25, 1999.

This invention was made with government support under Contract Number N00019-97-C-2001 awarded by the Navy. The government has certain rights in the invention.

BACKGROUND OF THE INVENTION

The invention relates to the field of optical gap measuring.

X-ray lithography is used for printing circuit features down to sub-100 nm dimensions. Proximity printing is generally used, in which an x-ray mask is separated from the substrate to be printed by a gap of generally less than 40 $\mu$m, and often less than 10 $\mu$m. The technology is developing toward requiring gap control to a tolerance within 100 nm and overlay alignment between successive printings of better than 10 nm. These tolerances are expected to become yet smaller as the technology develops.

There are great advantages in a scheme that requires no hardware in the path of the x-ray beams that are used to print the pattern from the mask to the substrate, and uses the same hardware as for the aligning function. Also, a scheme that does not require aligning before gapping is desired.

A scheme, referred to as Interferometric Broad-Band Imaging (IBBI) which meets the requirements for aligning has previously been developed and demonstrated within the MIT Nanostructures Laboratory for aligning overlay between successive printings to sub 10-nm accuracy, with limited capability for gap-measuring. This scheme is described in U.S. Patent Nos. 5,414,514 and 5,808,742.

Optical gap-measuring has been more elusive than aligning. Complications arise from the abundance of different light-paths, including those within the mask thickness, coupled with the high sensitivity to small effects when using coherent light.

One class of potential solutions has required mechanical scanning of the gap while observing a fluctuating intensity from optical interference. One approach in this class is described in U.S. Pat. No. 5,808,742. This class has the disadvantage that too much time is taken by the mechanical scanning, and the scanning can not take place during the x-ray exposure. However, such a method can be very useful for occasional calibration check, and is built into the present invention.

Another class relies on imaging of fringes. This is more attractive since it overcomes the problems introduced by the scanning. Also, it complements the IBBI aligning approach which is the subject of the above mentioned patents.

SUMMARY OF THE INVENTION

The invention represents an improvement over the gapping, i.e., gap-measuring, capabilities described in U.S. Pat. No. 5,808,742, and its subsequent divisional application Ser. No. 09/150,426, both of which are incorporated herein by reference.

An objective of the invention is to provide a system and process of measuring the gap between one substantially planar object, such as a mask, and a second planar object, such as a substrate, with a higher degree of sensitivity, accuracy, capture range, and reliability, than previously obtained. Other objectives are to achieve these goals while: a) requiring no mark on the substrate (for initial lithographic printing); b) not blocking the volume through which a lithographic exposing beam must pass; c) not requiring aligning before gapping; d) sharing optics also used for aligning of lithographic overlays; f) sharing the same field of view used in the aligning function of these optics; g) sharing imaging hardware and processing techniques used in the aligning; and h) providing rapid measuring capability consistent with production requirements. The invention provides a scheme that meets all the objectives and overcomes all the problems discussed above.

In particular, the invention uses the same hardware and inclined illuminating path as the complementary IBBI overlay-aligning scheme referred to above. In addition, a mark containing the gapping features may be combined with a mark containing the aligning features, so that both gapping and aligning features in the mark may be viewed within a single field-of-view of the imaging sensor in the IBBI/gapping optics. Spatial filtering, beneficial to both the aligning and gapping, can also be shared. The image-processing for IBBI and gapping will also be similar. It will be clear that this combination of functions will be valuable in a lithographic tool that handles both aligning and gapping.

According to the invention, gapping marks on a first plate, such as a mask, each contain one or more 2-dimensional gratings. Periodic structures, such as gratings, are commonly described by means of vectors that point along directions in which the structure is periodic. Thus, a two-dimensional grating can be described by two or more vectors. In this invention, each 2-D grating typically has a constant-period vector in the plane of incidence, i.e., the plane that contains the input beam and the normal to the first plate, and a varying-period grating-vector in the transverse plane. These gratings are fabricated on the surface of the mask facing the second plate, such as a substrate. Typically the gapping portion of a mark will have gratings only on the mask, and not on the associated part of the substrate-mark, to ensure that the relative misalignment is isolated from the gapping-measurement. In some cases the gratings could be on the substrate alone, but this would generally be less advantageous.

The varying period, sometimes called chirp, in the transverse plane is an innovative and unique aspect of the invention. Each of these 2-D gratings is typically formed in the shape of a narrow stripe, with the shorter dimension in the plane of incidence. For some applications, this shape may be varied.

The constant period in the plane of incidence permits the use of illuminating light at an inclined angle, and so removes the need for optical components in the path of the lithographic exposing beam. An inclined light source (as used by the IBBI), is arranged to illuminate these gratings, and the surface of the second plate, to produce two images of each grating, viewed on the same or similar inclined path as the illumination. The direct image will be referred to as the primary image. The secondary image corresponds to an image of the grating that has been reflected in the surface of the substrate. The distance apart of these images will yield the gap on a relatively coarse scale, to an accuracy within about one micron. The latter will provide a quick and useful measurement for ensuring avoidance of collision as the mask initially approaches the substrate.

Because of the varying transverse grating-period, the images also contain fringes, resulting from interference between paths having traveled different distances through the gap and the mask-plate as a result of successive diffractions and reflections. Without the grating-period variation, these interferences would cause each of the two images to have image intensity that is uniform at any one gap, but the intensity would fluctuate with changing gap. The varying transverse grating-period introduces varying transverse path-differences, which in turn result in interference-fringes in the images. It is found that the phases and periods, and particularly the phases, of these fringes vary with gap. Moreover, at larger gaps, when the primary and secondary images are distinguishable, it is found that the primary image has its phase changing with gap at a much higher rate than that of the secondary image. Measurements of the fringe-phases, coupled with measurement of the geometric separation of the two images, will yield an accurate measure of the gap over a wide range.

For direct self-contained calibration, a linear grating, with uniform period, is also included within the gapping mark. It uses an Inclined Diffractive Michelson (IDM) technique. This technique uses the same inclined illuminating path and hardware as used in the present invention and the complementary IBBI overlay-aligning scheme referred to above. It requires scanning of the gap, but this is acceptable for the initial calibration, and for subsequent occasional verifications. The inclusion of this self-contained calibration capability with the gapping function is another innovative aspect of the invention.

Additional gratings may be added, within the gapping mark, to extend the range of gap-measurement without ambiguity, and also to improve the accuracy of measurement. These additional gratings, like the one initially described, will have uniform grating-period in the plane of incidence, and different varying grating-periods in the transverse plane. These additional gratings will be of two varieties. The first, for improving accuracy, will be identical with an existing one except that the direction (or sense) of the varying period will be reversed. This will cause the phase of the resulting fringes to move in the opposite direction (or sense). Measuring the phase-differences between the two sets of contra-moving fringes will result in a more accurate measure of the gap. The second variety, for removal of ambiguity, will have a different rate of transverse grating-period change. This will result in a different gap-cycle, leading to a different set of ambiguities. This allows the correct measurement to be selected from different series of ambiguities by cross-matching the gap values.

The extra gratings assist in expanding the range of accurate gap-measuring down to very small gaps (i.e. to <20 μm which are important for x-ray lithography) where the primary and secondary images coalesce and their fringes can no longer be separately identified. The slower-moving fringes of the secondary image are thus absent and no longer available for breaking the ambiguities in the measurement obtained from the more rapidly moving fringes that still remain.

This gapping method requires a corresponding area on the adjacent substrate surface to be free of any feature that will have significant diffracting properties that might cause interference with the images that are used for the gapping. The presence of photoresist or other coating will affect the measurement. However, this will not be a problem provided the calibration is done with a similar coating. Alternatively, a table of offsets may be maintained to correct for such layers.

DETAILED DESCRIPTION OF THE INVENTION

Figure 1:
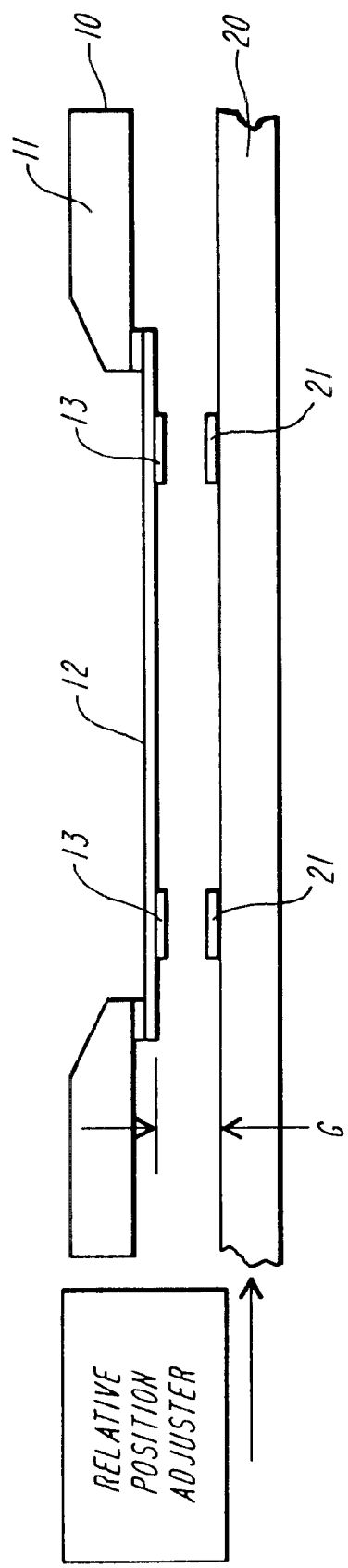
FIG. 1 (prior art) is a cross-sectional view of a mask and substrate.

FIG. 1 illustrates a cross sectional view of a conventional x-ray mask 10 separated from substrate 20 by a small gap, G. The mask 10 includes a support frame 11, membrane 12, and alignment marks 13. Complementary alignment marks 21 are located on the substrate and face the mask alignment marks 13.

Figure 2:
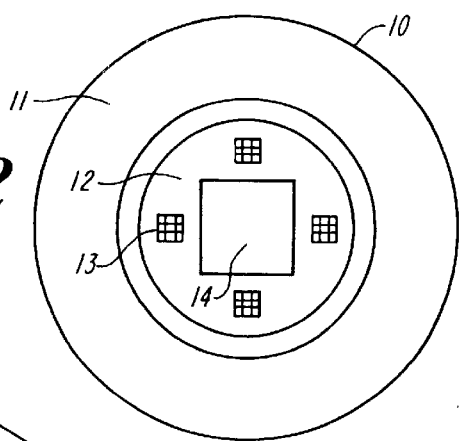
FIG. 2 (prior art) is a plan view of the mask showing alignment marks.

FIG. 2 is a plan view of a conventional mask 10, showing four alignment marks 13. The central region of mask 10 includes pattern region 14 that contains the pattern that is to be superimposed over a pattern on the substrate.

Figure 3:
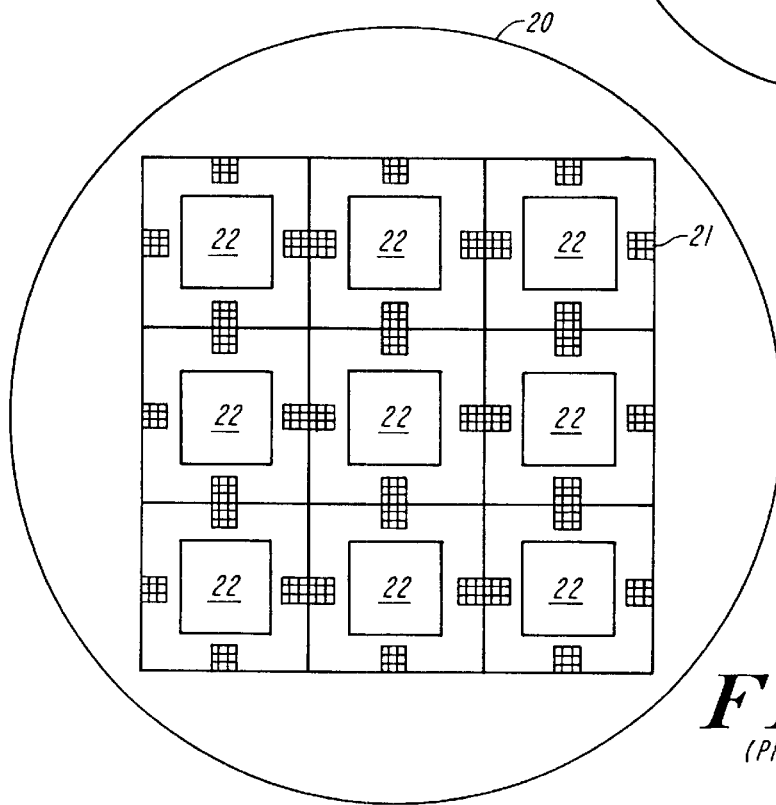
FIG. 3 (prior art) is a plan view of the substrate showing multiple identical regions to be exposed.

FIG. 3 is a plan view of the substrate containing multiple identical regions of patterns 22 over which mask pattern 14 is to be superimposed in a sequence of three steps: (1) move to one of the multiple sites; (2) align mask alignment marks with respect to substrate alignments marks; (3) expose mask pattern 14 on top of substrate pattern 22.

Visible or near-infrared light is preferably used as the illuminating source, spanning a wavelength band from 400 to 900 nm, but other wavelengths may also be used. The light must be collimated with good spatial coherence. In addition, it is necessary that grating periods exceed wavelengths used in the illuminating bandwidth, so that first order diffraction is possible. The first order diffraction angle is $$\sin \theta = \lambda/g, \tag{1}$$

where $\theta$ is the diffraction angle, $\lambda$ is the wavelength, and g is the period. Hence, first-order diffraction with $\lambda/g>1$ is not possible; it is desirable that grating periods exceed twice the value of any wavelengths used in the illuminating bandwidth, to ensure that first order diffraction occurs at an angle of no more than 30 degrees. Preferably, the alignment marks should include 10 or more periods of each of the paired gratings.

Figure 4:
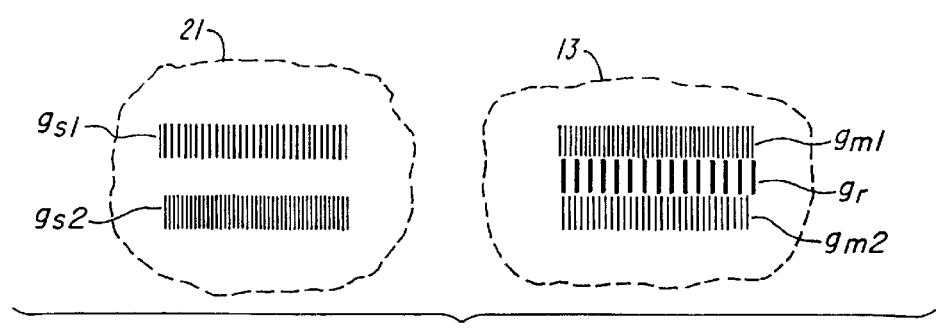
FIG. 4 (prior art) illustrates one form of complementary alignment marks.

FIG. 4 shows a conventional arrangement of pairs of complementary alignment marks with differing periods to increase the range of freedom from measuring ambiguity. This feature increases the range of misalignment that can be measured without ambiguity, or increases the capture range.

In one arrangement the substrate alignment mark 21 includes two simple linear gratings having different spatial periods $g_{s1}$ and $g_{s2}$. The mask alignment mark 13 includes two simple linear gratings having different spatial periods $g_{m1}$ and $g_{m2}$. In between the gratings $g_{s1}$ and $g_{s2}$, or between the gratings $g_{m1}$ and $g_{m2}$ (latter is shown in FIG. 4) is an unpaired reference grating having a period $g_r$ which is coarser than any of $g_{s1}, g_{s2}, g_{m1}$ and $g_{m2}$. The periods $g_r, g_{s1}, g_{s2}, g_{m1}$, and $g_{m2}$ are chosen so that $$g_r = g_{s1} \, g_{m1}/|g_{s1}-g_{m1}| = g_{s2} \, g_{m2}/|g_{s2}-g_{m2}| \quad (2)$$

This relationship ensures that $g_r$ is also the period of the two interference fringe patterns formed by the overlap of beams diffracted by the gratings. One such pattern results from interference of beams diffracted by gratings $g_{s1}$ and $g_{m1}$. The second such pattern results from interference of beams diffracted by gratings $g_{s2}$, and $g_{m2}$.

For example, if $g_{s1}$ is given a value of 4 micrometers and $g_{m1}$ the value 3.7 micrometers, then a value of $g_r$=49.33 micrometers satisfies equation (2). If $g_{s2}$ is given a value 33.64 micrometers and $g_{m2}$ the value 20 micrometers, then equation (2) is still satisfied with the same value of $g_r$=49.33 micrometers. Thus, equation (2) can be satisfied with $g_{s1}, g_{m1}, g_{s2}$ and $g_{m2}$ all having different values. In general, to avoid ambiguity, the periods $g_{s1}, g_{m1}, g_{s2}$ and $g_{m2}$ should have values that are not simple multiples of one another. There are some exceptions. For instance, the larger of $g_{s1}$, and $g_{m1}$ might be equal to the smaller of $g_{s2}$ and $g_{m2}$. Such rules will be apparent to those skilled in the art.

More such sets of grating-pairs and corresponding unpaired reference gratings can be added. Such additional sets further increase the range of freedom from ambiguity and thus extend the capture range. They also afford the opportunity for additional simultaneous measurements to reduce statistical noise in the alignment.

Figure 5:
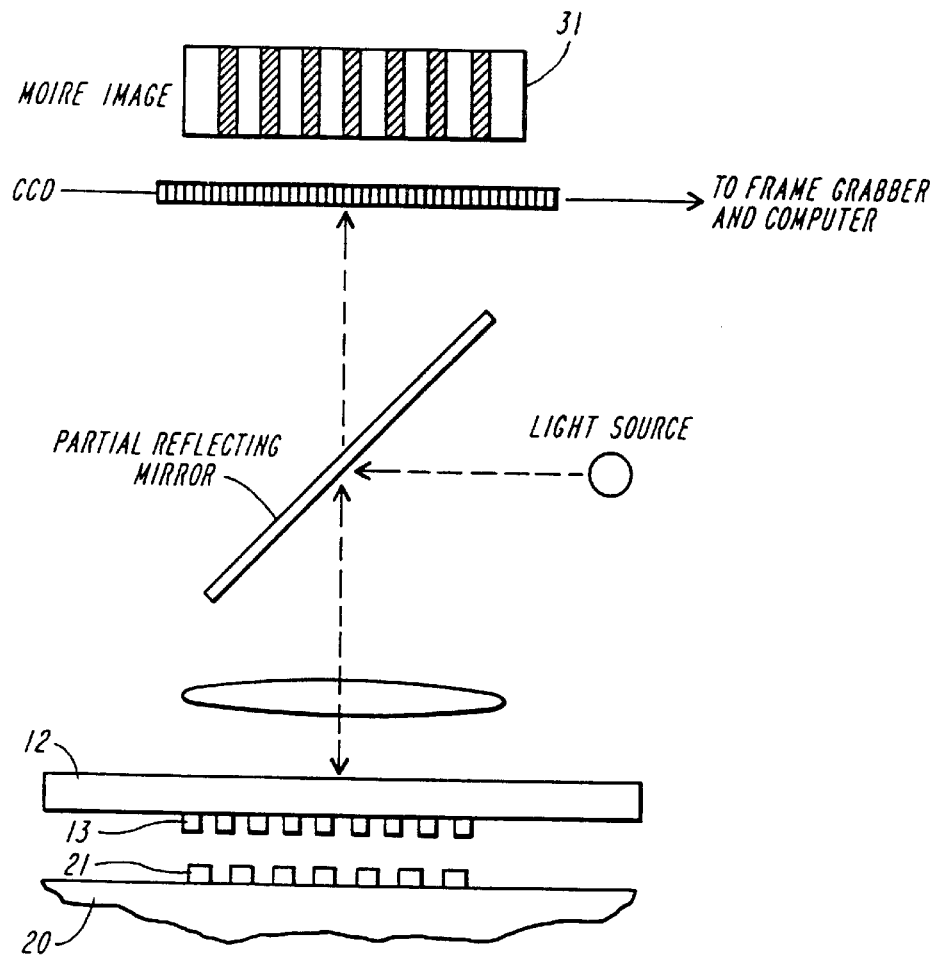
FIG. 5 (prior art) schematically illustrates viewing alignment marks with a microscope.

FIG. 5 is a schematic diagram illustrating the viewing of the pairs of facing alignment marks 21 and 13 by a microscope. An added fringe pattern resulting from the overlay of the gratings illustrated in FIG. 4 is included, to increase the range of freedom from ambiguity as discussed above. Alignment occurs upon attainment of a predetermined phase difference. For example, this phase difference could be zero, in which case the microscope image would appear as in FIG. 6 when alignment occurs. When the relative mask and substrate positions are slowly changed, the fringe patterns will translate at higher rates. This translation not only results in magnification of the relative motion, but also overcomes the ambiguity problem that would arise with only one grating pair when the relative motion is a multiple of a grating period.

Figure 6:
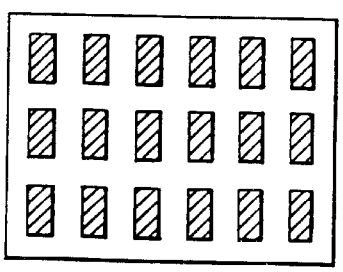
FIG. 6 (prior art) illustrates the image when the alignment marks of FIG. 4 are superimposed.

FIG. 6 illustrates the interference fringe patterns, and the reference pattern, observed when the alignment marks of FIG. 4 are properly superimposed.

Figure 7:
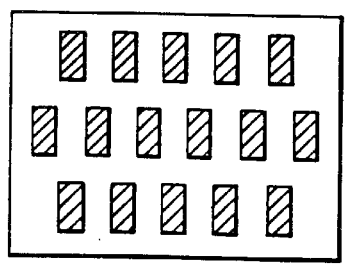
FIG. 7 (prior art) illustrates the image of FIG. 6 when mask and substrate are misaligned.

FIG. 7 illustrates an example of how the fringe patterns of FIG. 6 are shifted relative to each other when mask and substrate are relatively displaced perpendicular to the lines of the grating pairs.

Figure 8:
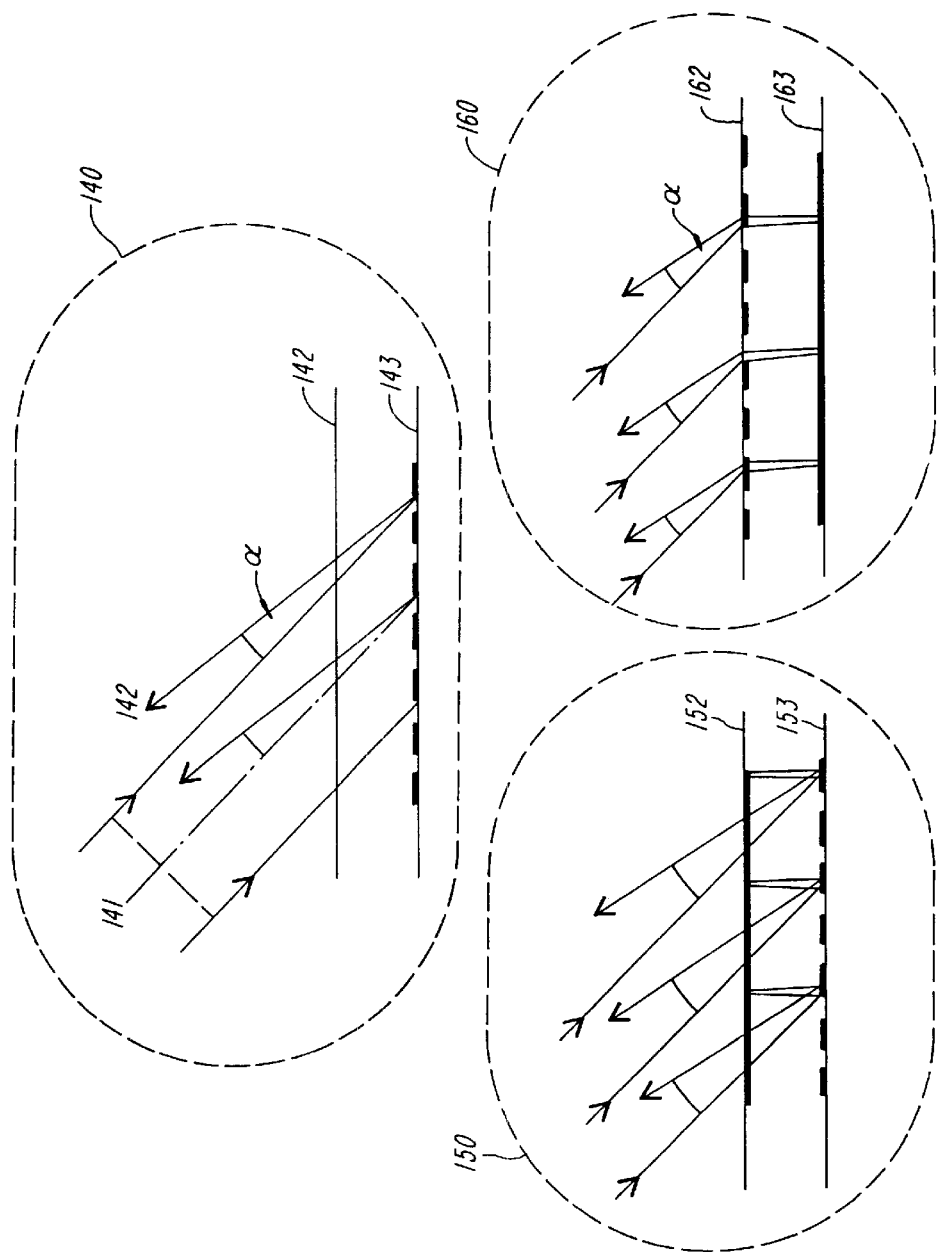
FIG. 8 (prior art) illustrates three geometries that achieve the off-normal illumination and observation of interference fringe patterns.

FIG. 8 illustrates three geometries that achieve the off-normal illumination and observation of the fringe patterns. The plane of the figure is the secondary diffraction plane. All primary diffractions from the gratings take place in planes perpendicular to the plane of the paper. In each geometry, the angle α may be finite, or may reduce to zero. In boundary 140 and in boundary 150 the interrupted alignment mark is on the substrate. In boundary 160 it is on the mask. In boundary 140, the incoming light 141 experiences a single diffraction when it encounters the interrupted grating on the substrate 143, and returns on itself (Littrow configuration), i.e., at angle α from its original direction. In boundary 150, the incoming light diffracts into a normal or near-normal direction when it encounters the interrupted grating on the substrate 153. It then reflects down again from the mask to be diffracted a second time to return along the path on which it came, i.e., at an angle α. In boundary 160, the incoming light diffracts downward from the interrupted grating on the mask 162, then is reflected upward to again be diffracted at the interrupted grating on the mask, to return along its arriving path, i.e., at an angle α. The arrangement in boundary 140 is preferred because there is less loss of light because it only experiences one diffraction in the secondary plane. However, the gratings on the substrate are liable to lose diffraction efficiency during lithographic processing. Hence, there may be circumstances in which the arrangement in boundary 160 is the preferred.

Figure 9A:
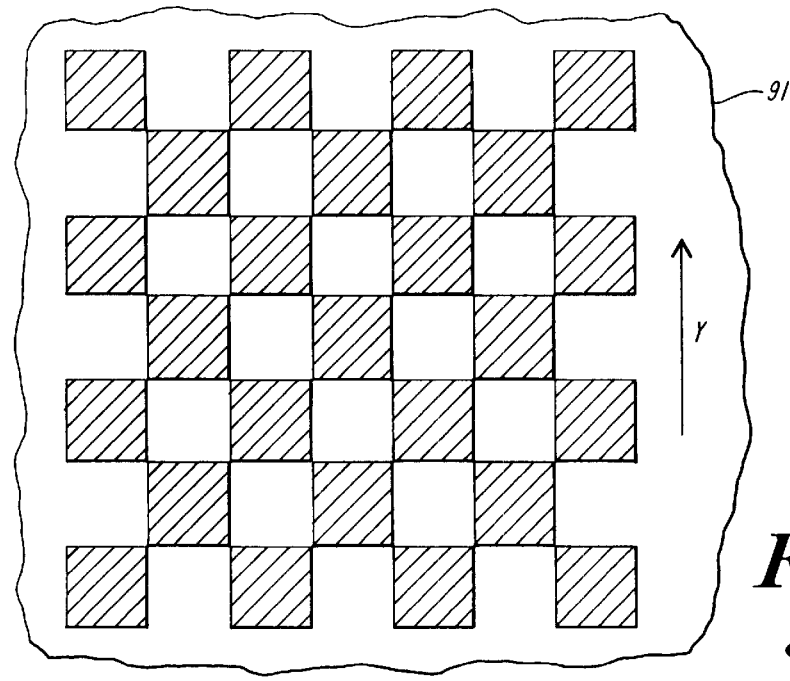
FIGS. 9A and B illustrates exemplary 2-D grating marks used in accordance with the invention, but not showing the chirp.
Figure 9B:
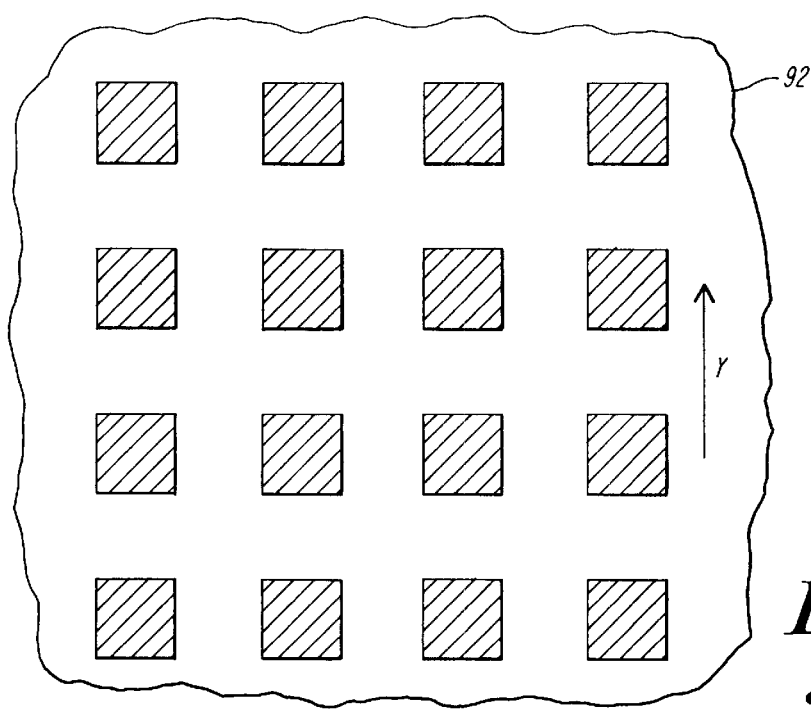

The invention utilizes two-dimensional gratings, of which two exemplary embodiments are shown with constant-period in FIGS. 9A and 9B. However the gratings for this invention differ by having chirp in one of the dimensions. Since they will be used for gapping, they will typically only have gratings on the mask, since relative misalignment between mask and substrate is not an object of the measurement. There may be cases where it is preferable to have the grating on the substrate instead of on the mask.

A "checkerboard" grating 91 is shown in FIG. 9A, and a "street" grating 92 is shown in FIG. 9B. The street gathers its name from its likeness to city blocks surrounded by streets. These gratings will typically be situated only on the mask, for reasons that will be understood with reference to the following.

Figure 10A:
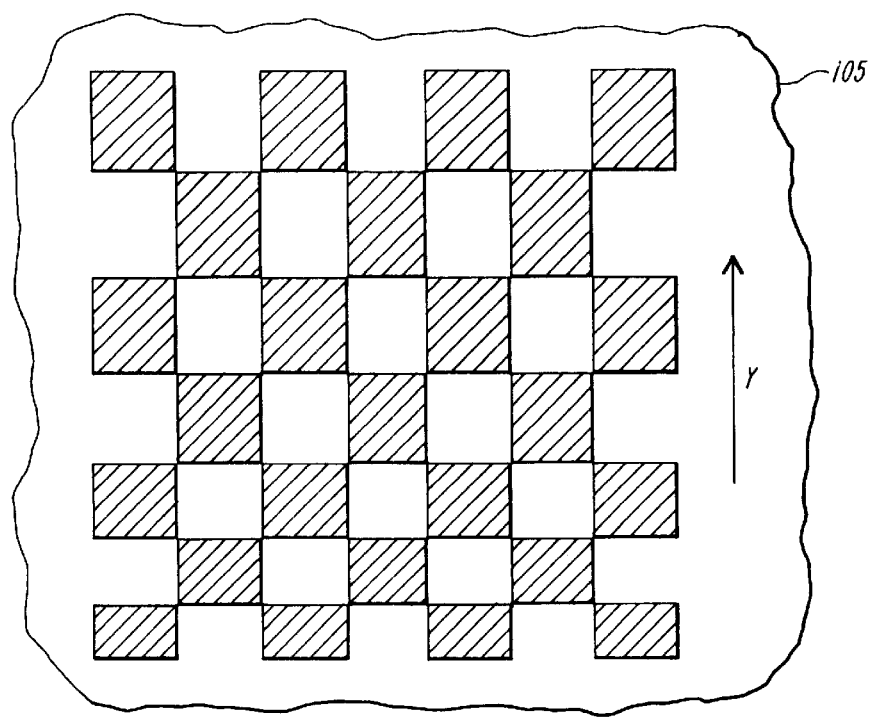
FIGS. 10A and B illustrates exemplary 2-D gratings chirped in the Y-direction in accordance with the invention.
Figure 10B:
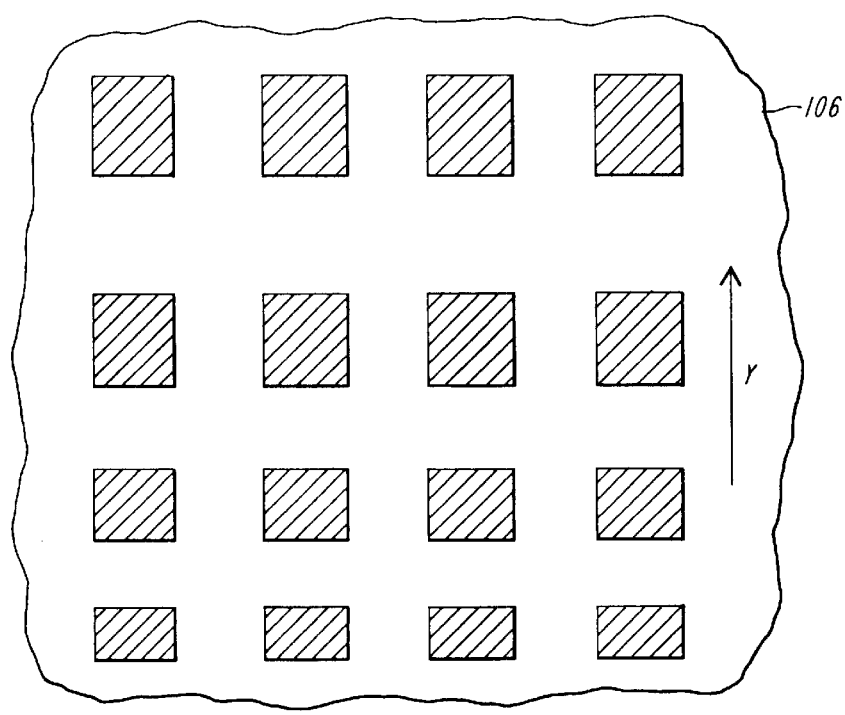

For the invention, the grating period is uniform in one dimension and varied in the other. FIGS. 10A and 10B illustrate a checkerboard grating 105 and a street grating 106 (corresponding to FIGS. 9A and 9B), respectively, when the grating-period in the Y-direction is thus varied. In the descriptions, the Y-direction will always be the "transverse" direction, which will be perpendicular to the incident-plane, i.e., the plane containing the light-path and the normal to the first plate (the mask).

The light used for the gapping illumination needs to be sufficiently coherent that it will produce the necessary interference fringes, and have the well-defined wavelength needed for calibration. Consequently, for the gapping measurement, the source previously described must typically have its spectrum narrowed by spectral filtering or by other means.

The resolution of the imaging optics may typically be about 7 $\mu$m. This will be sufficient to resolve the fringe periods, which will typically lie in the range between 7 and 40 $\mu$m; but not to resolve the grating-periods themselves, which will typically be in the range of 1 to 4 $\mu$m. Thus, the images will display the fringes but not the gratings themselves.

While many forms of two-dimensional gratings will serve, this description will assume they are in the form of a checkerboard or a street pattern as just described with reference to FIG. 10. It is desirable to use 50% duty-cycle gratings to avoid second-order diffractions, as indicated in FIGS. 10A and 10B. The blocking and transparent portions may be interchanged relative to those in FIGS. 10A and 10B, or the grating may be a phase grating with similar diffracting properties. The 50% duty-cycle checkerboard grating has certain advantages since it suppresses first-order diffractions that are not in both X and Y. This simplifies the diffraction pattern.

Figure 11A:
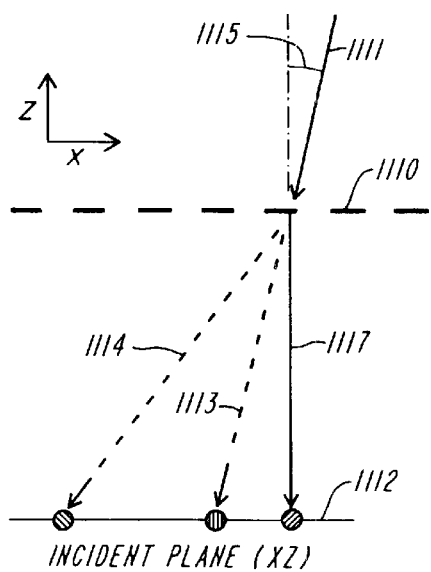
FIGS. 11A–C illustrates diffractions from a checkerboard grating used in NPG configuration.
Figure 11B:
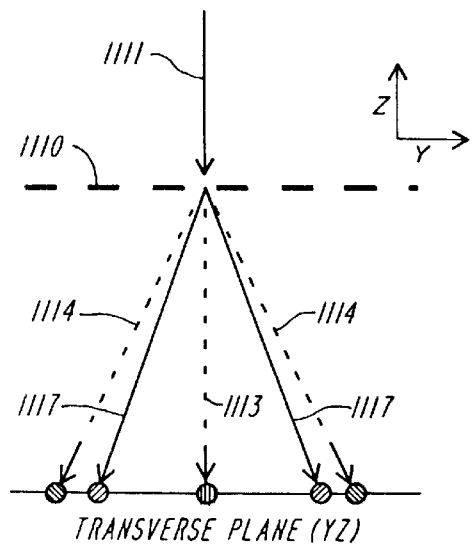
Figure 11C:
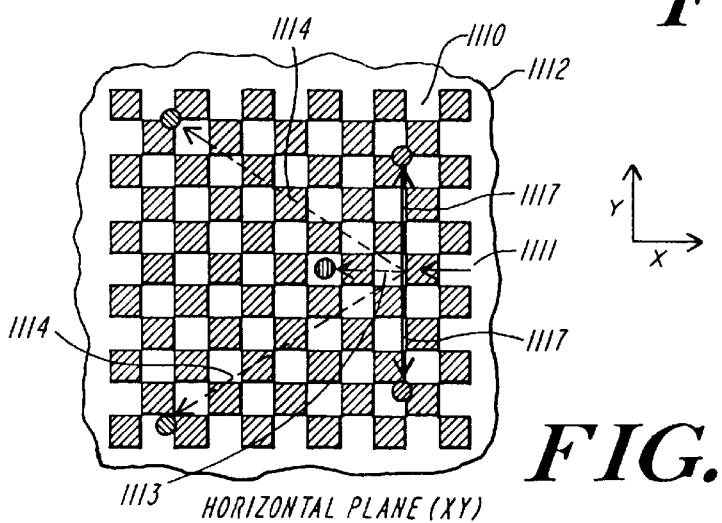

FIGS. 11A–11C show diffraction from a checkerboard grating pattern into a 2-dimensional array of paths with specific properties in the incident plane, transverse plane and horizontal plane, respectively. The incoming path 1111 is at angle 1115 from the normal to the grating. The period in the plane of incidence is chosen to have the first-order anti-clockwise diffractions 1117 into a plane that is normal (perpendicular) to the substrate 1112 and mask 1110. This is called the NPG configuration (Normal Plane in Gap). The solid and hatched circles in the drawing illustrate the points at which the rays meet the substrate surface, where they will be reflected again toward the mask, where some portion will be diffracted again toward the viewing optics. The rays that are shown solid are those that will be useful in the gapping measurement. Those shown dashed will not contribute to rays that will be accepted-by the viewing optics. They are the zero-order transmitted ray 1113 and the first-order clockwise diffractions 1114.

Complementary to the diffractions that have been described is another set of rays that are mirrored in the grating. These head into the plate that supports the mask, going toward its obverse surface, and some portion is then reflected from the obverse surface back toward the grating and in turn diffracted into paths that return to the viewing optics and thus enter into the observed interferences. These are not drawn, in an effort to keep the drawing simple to understand. However, they will be understood by anyone versed in the art of diffraction. The NPG configuration shown, used with the checkerboard grating pattern, is a preferred arrangement for the gapping since it has a relatively simple pattern of diffraction into the normal plane within the gap. It should be noted that the period in the transverse plane will vary with position in Y because of the chirp; hence the angles of diffraction into the transverse plane will vary with position of the light-arrival in Y. It is this changing angle that leads to the interference fringes observed in dimension Y when the region is observed through the viewing optics, as will be understood by those skilled in the art.

Figure 12A:
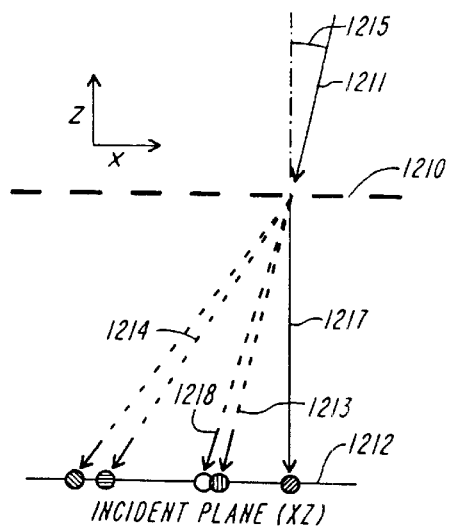
FIGS. 12A–C illustrates diffractions from a street grating used in NPG configuration.
Figure 12B:
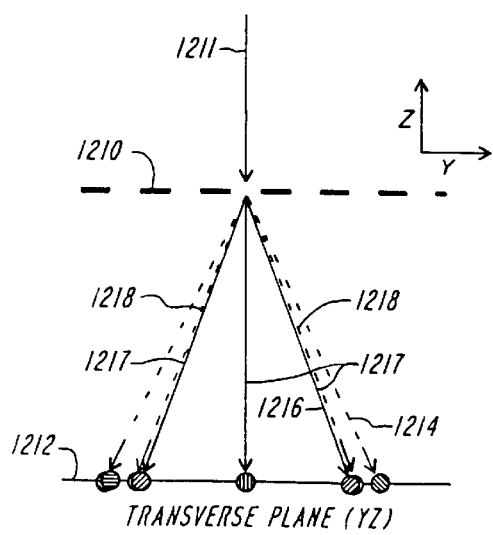
Figure 12C:
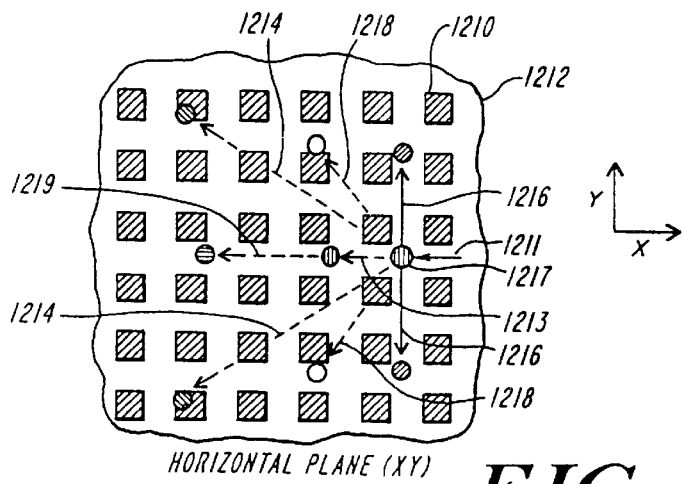

FIGS. 12A–12C show diffraction from a street-grating pattern into a slightly different and more complicated 2-dimensional array of paths with specific properties in the incident plane, transverse plane and horizontal plane, respectively. Again, the incoming path 1211 is at angle 1215 from the normal to the grating. Again, the period in the plane of incidence is chosen to have the first-order anti-clockwise diffractions 1217 into a plane that is normal to the substrate 1212 and mask 1210, i.e., the NPG configuration. Those versed in the art of 2-dimensional diffraction will understand that the street grating will exhibit diffractions that are suppressed by the checkerboard grating. This explains why FIG. 11 is more complicated than FIG. 10. Path 1213 is the zero-order transmission. Paths 1218 are first-order diffractions in Y only. Paths 1217 and 1219 are first-order diffractions in X only. Paths 1214 and 1216 are first-order diffractions in both X and Y.

Again, the useful rays for the gapping are drawn in bold, and the complementary diffractions into the material of the mask are not drawn, for simplicity. It will be noted that the street-pattern gives rise to an additional path 1217 in the aforementioned normal plane. This added ray is normal to both grating and substrate as observed in both the incident and transverse planes. Consequently the interferences that arise from the street-grating are more complex and may be more difficult to analyze. There is also an interesting configuration which has the zero and first-order diffractions going into two planes symmetrically placed about the aforementioned normal plane in the gap. They have yet more interferences, so are yet more complex, but may have useful attributes. There are other configurations that will also work, but the NPG configuration is chosen for example.

It will be appreciated that the diffraction-angles in the transverse plane of FIGS. 11A–11C and 12A–12C depend upon the period in the Y direction. Since this period in the Y direction is chirped, then those angles will vary with position. This, coupled with the same happening in the reflected diffractions toward the obverse surface of the mask-plate, and their resulting paths meeting and interfering within the viewing optics is what gives rise to the fringes in the Y direction as seen through the viewing optics. All these discussions will be returned to in greater detail later.

Figure 13A:
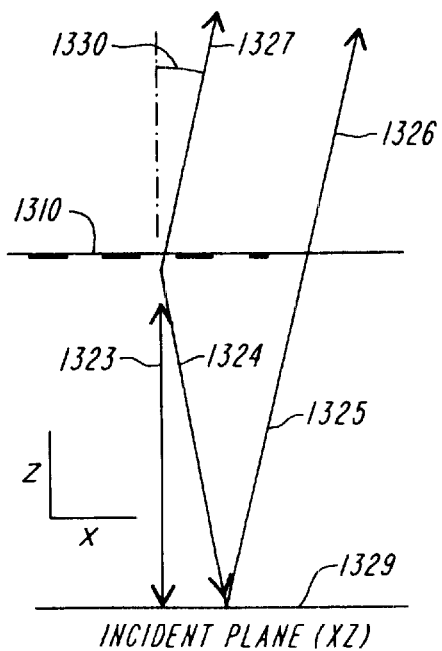
FIGS. 13A and B illustrates formation of the images from a checkerboard grating in NPG configuration.
Figure 13B:
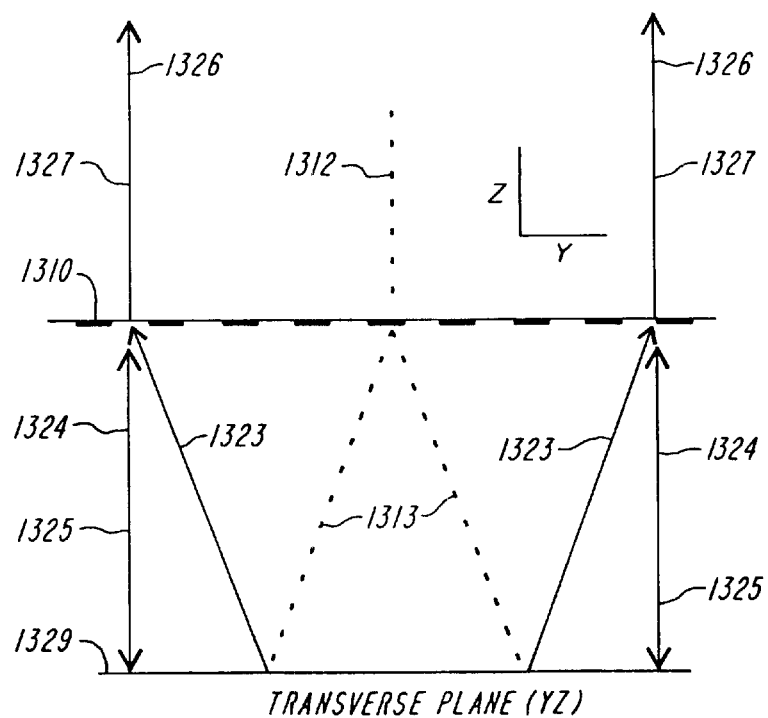

FIGS. 13A and 13B show, for the NPG configuration and the checkerboard grating of FIGS. 11A–11C, the transmissive diffractions, and the subsequent paths of the rays in the incident plane and the transverse plane. For simplicity, only the rays that contribute to the gap measurement are shown in the figures. The other rays end up in directions that do not enter the viewing optics. Their inclusion would only complicate the figure unnecessarily. The incident plane in which the grating has constant period, and the transverse plane in which the grating is chirped, are shown. For simplicity, the variation of angles in the transverse plane resulting from the chirp are not shown. The dashed path 1312 is the incoming path corresponding to path 1111 in FIGS. 11A–11C. The dashed paths 1313 are the first-order diffractions into the normal plane in the gap, i.e., the NPG plane previously described.

Ray paths 1323 are the reflections from the substrate 1329 surface, still in the normal plane. Paths 1327 are the first-order transmissively diffracted paths back toward the viewing optics. Paths 1324 are the reflectively diffracted paths arising from path 1323, headed toward the substrate surface at the same inclined angle 1330. These are reflected from the substrate surface as paths 1325 to emerge traveling toward the viewing optics parallel to paths 1327. If paths 1325 miss the edge of the grating as indicated in FIGS. 13A and 13B, then they will transmit through the grating-support plate and continue toward the viewing optics. These will lead to the secondary image that will be discussed later. Those skilled in the art of diffraction will appreciate that further paths heading toward the viewing optics will arise from rays that initially diffracted in reflection, headed toward the obverse of the mask, reflected toward the mask-grating, and then diffractively reflected again toward the mask parallel to path 1327.

Figure 14A:
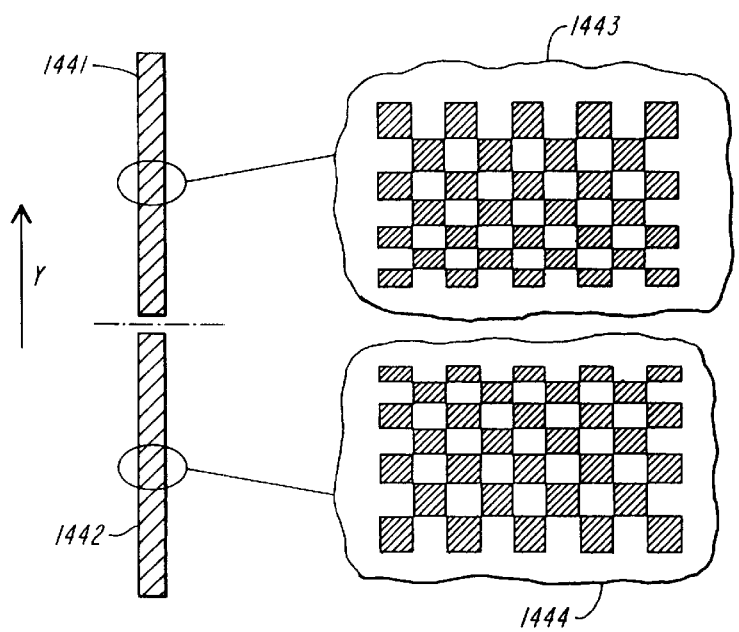
FIGS. 14A–C illustrates primary and secondary images and their fringes in NPG configuration.
Figures 14B, 14C:
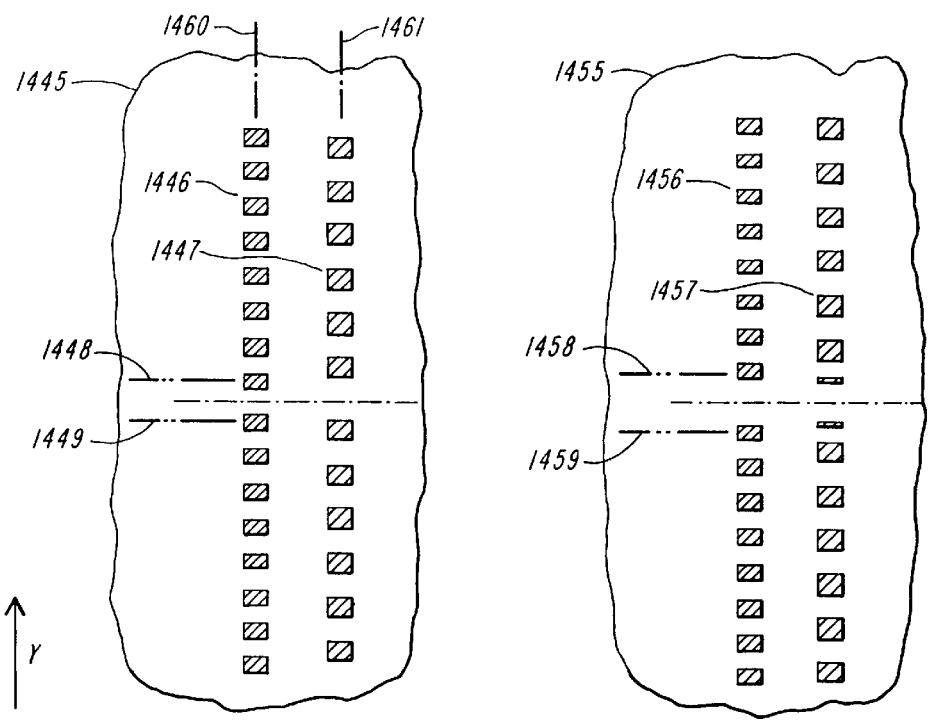

FIG. 14A shows two exemplary gratings end-to-end in the mask. Gratings 1441 and 1442 have constant periods in the X direction (to give the desired illuminating-angle) and different chirp rates in the Y-direction. The rates are different to help remove ambiguities in measurement, or to improve sensitivity. Enlarged areas 1443 and 1444 indicate the different chirp-rates in the Y direction. In this instance they have equal period but opposite sense. They are shown as checkerboard-gratings in this case, but could also be street-gratings. The illuminating and viewing optics have been described with reference to FIGS. 1–8. An exemplary image as seen through the viewing optics is shown in enclosure 1445 in FIG. 14B. Enclosure 1455 in FIG. 14C shows the image after a small change of the gap. Only interference fringes are seen since the viewing optics will not resolve the gratings themselves. One might expect to see only the two sets of end-to-end fringe-sets indicated by 1446 in enclosure 1445, and by 1456 in enclosure 1455. However, a secondary image is seen in each case, indicated by 1447 and 1457. This secondary image is attributed to the paths corresponding to 1326 in FIGS. 13A–13B.

The primary and secondary images typically have slightly different fringe-periods. There is a much greater difference in the rate at which the fringes move as the gap changes. Also, the primary and secondary images slowly move apart as the gap increases. At very small gaps (a few microns depending upon the illumination angle) the two images coalesce into a single image. The images and their behavior will be discussed in more detail hereinafter.

Two concepts are fundamental to the invention, and have not previously been applied to gap measuring, which will also be referred to as "gapping". The first concept relates to generating fringes in the images. The second concept relates to generating a secondary image as well as the primary one.

While the period of the grating-array is constant in the vector-direction lying in the plane of incidence, the period varies in the direction transverse to the plane of incidence as illustrated in FIGS. 10A–10B. The transverse period may vary continuously, or in discrete steps. The varying transverse-period introduces fringes into any image of the grating pattern, as seen through the imaging optics. With constant grating-periods, such an image would have uniform intensity, which fluctuates with gap changes. The fringes that are observed when the transverse grating-period varies arise from coherent interference between varying optical lengths of the paths along which light returns toward the microscope. These paths (not all varying) include the following:

a) Transmissive diffractions through the mask-grating toward the substrate, where they are reflected back, and then diffracted again at the mask-grating to return within the acceptance angle of the microscope. Such paths are illustrated in FIGS. 11A–11C, 12A–12C and 13A–13B; and b) Reflective diffractions at the mask-grating toward the mask's reverse surface, where they are reflected back toward the mask-grating and then reflectively diffracted again to return within the acceptance angle of the microscope. Such paths are mirror-images of paths illustrated in FIGS. 11A–11C, 12A–12C, and 13A–13B; the reflection being in the mask-surface which bears the grating. It will be appreciated, however, that the equivalent of the gap then becomes the much-smaller mask thickness, generally less than 2 μm.

The illuminating light may be divided into as many as 18 paths at the first encounter with a 2-D grating, counting only zero and first order diffractions in transmission and diffraction. More paths may be added at the second diffraction of the paths that are reflected back from the substrate, and mask-obverse, toward the mask for a second diffraction. However, only a small portion of the resulting paths return toward the microscope within its acceptance angle. An exemplary embodiment uses f/10 optics, so the acceptance solid-angle is less than 0.01 steradian. This solid-angle may be further reduced by spatial filtering within the viewing optics. This severely limits the number of accepted paths. However, depending upon configuration, as many as 12 resulting paths may still enter the microscope optics. Consequently, the observed interference pattern may be complex. Use of the checkerboard grating, instead of a street grating, roughly halves the number of strong diffractions at each mask encounter. The checkerboard grating thus simplifies the resulting interference pattern and is likely to direct more energy into any particular fringe-set in the observed image.

When there is no variation in grating-period, the interference pattern has no fringes. It has uniform intensity that goes through rapid cycles of intensity as the gap is changed. Hence, without the grating-period variation, this effect can be used for a very precise approach for measuring gap with scanning. This scanning method can be useful for precise calibration of the faster non-scanning measurements.

In accordance with an exemplary embodiment of the invention, the 2-D grating has its period in the transverse dimension varied. When this grating-period is uniformly varied, i.e., chirped, then the interference-pattern is observed to have a constant period in its fringes in the case of the checkerboard pattern. The fringe-period is not necessarily linear when a street grating is used. When the gap is changed, these fringes translate rapidly across the image, and the period of the fringes changes more slowly. The fringes in the primary image translate through one fringe-period, i.e., $2\pi$ of phase, when the gap is changed by about ¼ of the illuminating wavelength, depending upon the precise configuration. Thus, when calibrated, this forms the basis of a very precise and accurate gap-measurement, based upon phase measurements on the image, without need to scan the gap. However, note that the resulting gap-measurement will not be unique. Each measurement will give many possible highly accurate values for the gap, separated by intervals of approximately ¼ wavelength intervals.

The accuracy may be further increased by measuring the relative phase-motion of two similar gratings with reversed chirps. The ambiguities will then be separated by about ⅛ wavelength intervals.

One approach to resolve the ambiguities is to add another grating in the field of view, having a differently-varying transverse grating-period. This is illustrated in FIGS. 14A–14C, which show the first grating as 1441 and the second as 1442. The enlargements 1443 and 1444 show how in this case the gratings are chirped in opposite directions in the Y direction. When the added grating is used for decreasing ambiguities, it is more likely to have a different period, but the sign might be in either direction. These differently-varying periods may be chosen such that, over the desired range of measurement, the ambiguities of the two gratings will only match at the correct gap value of gap. Even larger ranges of gap-measuring capability may be obtained by adding another such grating. However, the need for adding such gratings is reduced by applying the above mentioned second concept as described hereinafter.

In an alternative embodiment, the variation of grating-period will not be uniformly continuous. Since the local intensity is a function of the gap and the local period, then stepwise changes in grating-period will cause step-wise changes of intensity. It will be clear to the reader that the steps can be designed to give a unique intensity pattern for any selected gap. Furthermore, carefully designed variations in the pattern can indicate extent of departure from the selected gap. Careful arrangement of the steps can also be equivalent to including the ambiguity-solving properties of multiple gratings. The uniformly continuous variation of grating-period is just one example of varying the transverse grating-period to achieve the desired end.

The chirped grating is prepared in the form of a narrow stripe transverse to the plane of incidence as each of the gratings is configured in FIGS. 14A–14C. With a narrow-enough stripe, and large-enough gap, a secondary image of the stripe is observed, displaced from the primary image by a distance proportional to the gap. This is illustrated in FIGS. 14A–14C. Enclosure 1445 shows the primary and secondary images 1446 and 1447 for one gap, and enclosure 1455 shows the primary and secondary images 1456 and 1457 after a small change in gap. These separate images are distinguishable over most of the gapping range. The secondary image 1447 also contains a linear set of fringes with approximately the same period as in the primary image 1446. A striking property of these fringes in the secondary image is that they translate in the Y-direction at a much slower rate than do the fringes in the primary image when the gap changes. The enclosure 1455 illustrates how the fringes have translated when the gap changes from that of enclosure 1445. This gap-cycle period for the secondary images may be about 25 µm, depending upon the configuration details. This provides a coarser gap-measuring resolution (within <100 µm) than is obtained from the primary fringes, and thus can resolve ambiguities from a measurement that uses only the primary image.

A yet coarser measure of the gap, to about 1 µm resolution, is provided by the geometric offset between the primary and secondary images, i.e., the distance between the center lies 1460 and 1461. This becomes greater as the gap becomes greater. This gives an unambiguous measurement that will resolve any larger-scale ambiguities, and provide a rapid measurement accurate enough for collision avoidance when the mask is approaching the substrate. Simple consideration of the geometry yields the following relation for yielding the gap, since the secondary image is geometrically in the position one would expect for an incoherently produced reflection of the stripe in the substrate surface.

$$Gap = \frac{s}{2\text{TAN}(\theta i)} \quad (3)$$

where s is the distance between stripe-centers, and $\theta i$ is the inclination-angle of the viewing path.

FIGS. 14A–14C illustrate the appearance of the gratings and of the primary and secondary images that will be observed in the viewing optics. FIG. 14 shows two stripes, 1441 and 1442, situated end to end. Each stripe is in the form of a checkerboard grating with constant grating-period px in the X-direction and varying period py in the Y-direction, as indicated in enclosures 1443 and 1444. The variation in py is equal, but in the opposite sense, in the two stripes. A typical resulting image 1460 is illustrated in FIG. 14B. Fringes are seen in both a primary image 1446 and in a secondary image 1447, but the grating is not resolved. Each set of fringes can be ascribed a period and a phase. The period and phase is extracted by doing a Fast Fourier Transform (FFT). For example, elements 1448 and 1449 indicate the phases obtained for the primary images of the two stripes on each of the primary and secondary images of the two stripes. It is found that the difference between these phases varies cyclically as the gap is varied, as has been described. In particular, the phase difference (from 1448 and 1449) of the primary image cycle changes much faster than of the corresponding phase-difference for the secondary image.

In FIG. 14C, enclosure 1455 shows how the image has typically changed from that of enclosure 1445 of FIG. 14B as a result of a small change in gap. The phase difference in the primary image (1448–1449 to modulus of $2\pi$) has changed (1458–1459 to modulus of $2\pi$), for example. Once the system has been calibrated, then a measure of the phase differences in the primary and secondary images will give two series of possible measurements of the gap. However, there will be agreement for only the correct measurement; except perhaps for larger-scale ambiguity that can be resolved by the geometric offset between the primary and secondary images. The ambiguities arise from a single phase measurement because a phase-change of $2\pi N$ cannot be differentiated from a phase-change of $2\pi(N-1)$ and so on.

For gaps smaller than about 20 µm, the primary and secondary images of FIGS. 14B–14C will coalesce sufficiently to make the unique fringes of the secondary image no longer separable. The coalescing gives the information that the gap is less than about 20 µm, but this information will not in itself unravel the ambiguity from the rapid phase-translation of the coalesced image. A second primary grating may still be necessary to sufficiently resolve the remaining ambiguities at the smaller gaps.

Development of this invention toward larger angles of inclination should maintain separation between the primary and secondary images down to smaller gaps. Development of the present invention by using discretely-varied py may also avoid the need for additional gratings.

For illustrative purposes with respect to the description of 2-dimensional diffraction, the following convention, consistent with the figures, will be used. The mask and substrate lie in planes parallel to the XY plane. Incident and viewing directions for the light lie in planes parallel to the XZ plane. The Z direction is perpendicular to mask and substrate. The short dimension of stripe is in X direction, with constant grating-period px. The long dimension of stripe is in the Y direction, with varying grating-period py. Diffraction in the X and Y directions is labeled by (l, m, n), where: l is t or r to denote transmissive or reflective diffraction, m is an integer to denote the order of diffraction in X, and n is an integer to denote the order of diffraction in Y.

For the preferred normal plane in gap (NPG) configuration, the constant grating-period px is chosen to give first-order reflective and transmissive diffraction of the arriving light into the YZ plane, i.e., perpendicular to the mask. Thus, period px is chosen to satisfy the relation $$px = \frac{\lambda}{\text{SIN}(\theta i)} \quad (4)$$

where $\lambda$ is the wavelength (may be about 690nm) and $\theta i$ is the angle between the incident light and the mask normal. This inclination angle is about 20 degrees.

Consequently, a portion of the arriving light, on meeting the grating, diffracts into a fan of paths in the YZ plane, as illustrated in FIGS. 11, 12 and 13. The transmissive diffractions are described as (t,–1,n) and reflective paths are described as (r,–1,n). Different paths in the fan have different values of n. For a grating with 50% duty cycle, the 2nd order diffractions have no strength, thus the only diffractions in this fan that have significant strength for less than third-order (–3<n<+3) are n=–1 and n=+1. Hence, ignoring orders of 3 or higher, the fan includes: transmissive diffractions (t,–1,–1) and (t,–1,+1) headed toward the substrate, and reflective diffractions (r,–1,–1) and (r,–1,+1) headed toward the mask-obverse.

The content of fans for other orders in x will be ignored since they have no path that can ultimately pass through the acceptance angle of the viewing optics with any significant strength. The following is a brief description of the diffractions that contribute to forming the images used in the present invention. The description will be repeated in more detail for this NPG configuration when describing an exemplary embodiment.

For the exemplary NPG configuration as previously described, some of the inclined illuminating light is diffracted fanwise into a transverse plane that is perpendicular to the mask and substrate surfaces. Some portions of the light following these fanwise paths then reflect from the substrate surface back toward the mask, where they may transmissively diffract back toward the viewing optics, by (t,+1,±1) diffractions. Other portions of the light, following these fanwise paths, travel into the mask and then reflect from the mask's obverse surface back toward the grating, where some portion will then reflectively-diffract back into the arrival path and reach the viewing optics, by (r,+1,±1) diffractions.

Since there is a diversity of path-lengths, depending upon the gap and the local transverse grating-period, the resulting interference pattern imaged through the optics will contain fringes, the details of which will depend upon the gap between the plates, the mask's optical thickness, the grating chirp rate (the variation in grating-period), and the illuminating wavelength.

A feature of the present invention is the discovery that the geometry may be tailored such that a secondary image of the stripe is also used. The much-slower cycling of the fringe-translation in the secondary image, as the gap changes, indicates that the mask-thickness contribution has been suppressed. FIGS. 14B and 14C illustrate the appearance of both images, in enclosures 1445 and 1455.

The secondary image is attributed to the following. Any path approaching the mask grating from the gap that will be diffracted toward the viewing optics must also have a complementary "twin" diffraction-path back into the gap, indicated by path 1324 of FIGS. 13A–13B. That complementary path is the mirror image of its twin path toward the viewing optics, as will be recognized by anyone versed in the art of diffraction. So, this complementary path travels toward the substrate in the same plane as the twin path toward the viewing optics, with the same inclination angle down into the gap. This means that it will reflect from the substrate at the same inclination-angle. Thus, it will now head toward the viewing optics again along path 1325. After traversing the gap a major portion will thus transmit through the mask and still head toward the viewing optics along path 1326, parallel to its twin beam 1327. During its traversal of the gap it will have "walked" (displaced laterally) by distance $2g\text{TAN}(\theta i)$ across the mask in the incident plane, where g is the gap and $\theta i$ is the inclination-angle. Hence, a secondary image is made up from these complementary paths. It will be appreciated that this secondary image will look geometrically as if it is a reflection of the primary image in the surface of the substrate. However, the interference fringes behave differently.

One might expect successive generations of such complementary images, offset by $s=2g\text{NTAN}(\theta i)$, where N is a succession of integers. However, the first of them will be far stronger because its first complementary path is reflecting off a highly-reflective grating, whereas the further ones, if they are contributing to a separable secondary image, will meet the mask again outside the grating area, and so will reflect much less.

The secondary image merges into the primary one as the gap becomes small enough that the complementary paths return to the grating. One can see that the fringes from the secondary image will tend to linger on the edge of the coalesced image, since successively formed complementary paths are then more likely to be generated, albeit at lower strength. These successive images might be looked upon as reflections of reflections in the substrate surface.

Provided that these complementary paths that lead to the secondary image are principally formed from the paths returning from the substrate, they will contain little information from the mask-thickness. Hence, they will not show the strong and rapid gap-cycle that the primary image exhibits when viewed directly. The strong and rapid cycle results only from beating between paths that have traversed the mask round-trip and the gap round-trip.

One might expect paths returning from the mask-obverse to contribute to the secondary image. The same argument would say that they should also have a "twin" heading along the same mirror-image path toward the substrate. If that were the case, one would expect a similar rapid cycle of intensity in the secondary image as the gap is changed. But this is not seen. This is attributed to the grating's diffractive transmittance, as seen by light approaching from the mask-obverse, being much smaller than its diffractive reflectance, as seen by light traveling from the substrate surface. This effect may be compounded by the typical presence of a plating layer in the mask. This is a very thin metallic layer that is introduced on the surface of the membrane to provide a base onto which the details of the mask are plated. This continuous plating layer is normally left in place since it does not significantly attenuate the x-ray beam, and is helpful should the mask ever need repair. It does, however, attenuate optical wavelengths, as used for this measuring scheme, by about 50%. The light arriving from the mask-obverse must pass through this layer on its path toward the substrate surface on its way to the secondary image, while the path from the substrate surface is diffractively-reflected before encountering this layer. Thus, while the combination headed toward the viewing optics from the mask grating (from the primary image) has a strong fast beat, the twin combination headed toward the substrate shows no significant fast beat.

A primary image of the stripe is expected from the diffractions described above. This primary image is positioned where the stripe is expected to be seen. The checkerboard grating-details are not observed since the microscope has insufficient resolution. With no py chirp there are no fringes in this image. If the gap is scanned, then the intensity fluctuates as would be expected. The fluctuation is attributed to beats between the various path-lengths of the paths diffracted into the YZ plane and then back toward the microscope. The gap and mask optical thickness will be referred to as g and t, respectively. The path-lengths include 2g and 2t from the (−1,0) diffractions if they exist (they don't for the checkerboard) and longer paths from (−1,±N) diffractions to substrate and mask-obverse. Accordingly, there are beat-periods expected when the gap is scanned, and indeed a complex cycle of beats is observed. Since the (−1,0) paths contain energy when using the street grating, but not when using the checkerboard grating, then the street interferences are expected to be more complex.

When py is varied as a function of y, then fringes are observed in the primary image of the stripe. These fringes are stationary in the absence of motion of any of the components. If the gap is scanned, then the fringes move rapidly, and the fringe-period decreases as the gap increases. A fast cycle of transverse fringe motion is observed, with period of about ¼ wavelength in gap (depending upon the chirp-rate). This rapid cycle is attributed to beating between paths through the mask-thickness and those through the gap, modified by the transversely varying period. The combination of fringe-period and phase appears unique with gap, for a given wavelength and given chirp of transverse grating-period. Consequently a calibration of fringe-phase against gap will give a method of measuring gap, albeit with some ambiguity each time the fringes pass through a period. The difference in fringe-period between successive cycles of fringe-motion is likely to be too small to measure accurately to resolve this ambiguity. This approach gives a very high precision, but some ambiguity, in a measurement of gap.

A secondary image is observed, of comparable intensity to the primary image. This image has the same stripe-shape and dimensions. It is offset in the same way that one would expect of a reflection of the stripe in the substrate. Its separation from the primary image increases with gap, because of the inclined viewing. At very small gaps (less than about 25 $\mu$m) the separation is less than the width of the stripe and the resolution of the microscope (7 $\mu$m), so the secondary image then coalesces with the primary image, as would such a reflection.

When the grating-period py is chirped, high-contrast fringes appear in this secondary image, with period and phase changing as a function of gap. These fringes do not cycle as rapidly when the gap is scanned as do the ones in the primary image. Accordingly, it gives a quick and simple measurement, on a coarser scale, to resolve ambiguity of a much more precise measurement from the primary image. As with the primary image, there are no fringes when there is no py chirp. Expected accuracy is within 50 nm. The absence of the rapid cycling in this secondary image is attributed to its carrying no information from mask-obverse reflections.

Combined analysis of the primary and secondary images will give an accurate unambiguous measurement of gap. The secondary image on its own, from the period and phase of the fringes, yields a relatively coarse measure of the gap. Use of two gratings with chirp in opposite directions may lead to sufficient accuracy from the secondary image alone (so that the phase change actually measured is doubled). The secondary image may be used on its own, if sufficiently accurate for the requirement, or used to unravel the ambiguity of the much more precise measure from the primary it image. However, the primary image will be needed for measuring the smaller gaps that result in the two images coalescing. During the initial overlapping the fringes in the secondary image are still usable, but at the smaller gaps they are not separately observable. The behavior of the fringes are repeatable, hence they can be calibrated.

The street grating also gives both a primary and a secondary image of a narrow stripe. Both images are fringed when the transverse grating-period py is varying. These fringes also translate when gap is changed.

Other forms of 2-D gratings have not yet been experimented with. However, it is clear that the invention can be developed to a whole realm of 2-D gratings, some of which may prove to be even more advantageous than the checkerboard and street gratings that have already been explored. The common requirement is that transverse grating-period py be varied, either continuously or discontinuously, as taught in the present invention. Note that py may be a function of X as well as of Y, with possible advantages.

For an alternative "Littrow" configuration, the constant grating-period px is chosen to satisfy the equation $$px = \frac{\lambda}{\text{SIN}(2\theta i)} \quad (5)$$

This is the condition for a linear grating to diffract light back toward the source. With a 2-dimensional grating, then one of the fans of diffraction will include the direction back to the source.

In more detail, this Littrow diffraction results in the zero and first-order diffractions taking place into three fans transverse to the plane of incidence, of which one includes the path back to the source. The three fans correspond to the m=−1,0,+1 orders. Each fan contains the n=−1,0,+1 orders corresponding to the m value of the fan.

Two of these fans, important to the present invention, are tilted at angles ±θi from the YZ plane and perpendicular to the plane of incidence, where θi is still the incident angle. The two fans correspond to m=−1 and 0. They are important because they contain paths that lead back to the receiving optics after no more than one reflection and possibly another diffraction.

This configuration is also found to give a primary and a secondary image of a narrow stripe, with both images fringed when the transverse grating-period py is varying. These fringes also translate when gap is changed. This alternative configuration also appears to have possibilities for measuring gap in the same mainer as the NPG configuration. The comments above for extension to other forms of 2-dimensional grating also apply for the Littrow configuration.

Although scanning methods are not generally acceptable for routine gap-measurement, they are acceptable for calibration purposes, which are only required occasionally. Two such, related, scanning methods will now be described that are suitable for such occasional calibration. Both use the same hardware as do the measurements. Both methods are absolute interferometric methods, referenced to the known wavelength of the illumination.

The first, Fabry-Perot calibration, is the more straightforward method, but does require a second set of microscope viewing optics with its viewing path adjusted to be perpendicular to mask and substrate. Mask and substrate are initially adjusted parallel. This can be done by a variety of well-known means, including observing the interference fringes reflected from the surfaces using a narrow-spectral-line source, or may be done using three of the gapping instruments that are at least approximately calibrated.

The vertically-viewing optics are then directed at a transparent portion of mask immediately adjacent to the mark that is to be calibrated. The image of that area where there is no mark will be an area of uniform intensity, determined by the coherent sum of light reflected from the substrate, the mask-surface facing the substrate, and the mask-obverse surface. The observed intensity will vary with gap, as is well known by anybody versed in the art of Fabry-Perot interferometry. Moreover, it is well known that by scanning such a gap, the intensity will vary sinusoidally with gap, and the gap at any point in the scan can be inferred, knowing the mask thickness, to an ambiguity of±Nλ/2, where λ is the known wavelength of the light, and N is an integer. If the mask thickness is not known, then it may be determined from a scanning measurement in which the mask is lifted from contact with the substrate during the scan.

The value of the integer N may be determined in a number of ways, including having a second spectral line present, so the ambiguity in its measurements do not coincide with those of the first. This can be accomplished in one scan with both spectral lines present, and Fourier Transform analysis applied to separate out the two sets of sinusoidal variations, as is well known to anybody versed in the art of Fourier Spectroscopy. Alternatively, the same information can be obtained in successive scans, each at one of the wavelengths. The calibration is done by scanning the gap while images from the vertically-viewing and the inclined-viewing microscope/optics have their images recorded simultaneously, at closely-spaced gap-intervals. The images are then compared to extract the calibration.

A second method is referred to as inclined diffractive-Michelson (IDM) calibration, or the quasi-Michelson method. In this case only one microscope is needed. A linear-grating is required on the mask, within or adjacent to, the 2-D grating to be calibrated, and within the same field of view. The vector of the linear grating is in the incident plane, and has a period such that the illuminating light is diffracted into the perpendicular to the mask and substrate planes. Light is thus diffracted both toward the substrate-surface and toward the mask-obverse surface. Some portion of the light in these paths reflects back to the grating, and then diffracts back toward the viewing optics. The image of this calibration-grating area will be uniform, determined by the coherent sum of light reflected from the substrate surface and the mask-obverse surface. Since the two path-lengths are different, by twice the difference between the mask and gap optical-thicknesses, there will again be a sinusoidal variation in the uniform intensity when the gap is scanned. Hence, the calibration is performed in exactly the same way as the Fabry-Perot calibration.

The calibration is performed by scanning while recording images, and then comparing either the recorded Fabry-Perot or the diffractive-Michelson calibration with the simultaneously recorded chirped-fringe images. Both methods of calibration are accurate to a small fraction of the wavelength of the light that is used, but do need the scan for the accurate interpretation. In contrast, the chirped-period marks of the invention will give an accurate measurement of the gap from a single image, once the calibration has been carried out. Thus, the chirped-period method of measuring gap, which is the subject of the invention, is valuable in the general case where scanning is undesirable during lithographic fabrication, or other applications.

There are subtle aspects of both calibrations that could produce small departures from the expected sinusoidal behavior while scanning. The differences between the two techniques are sufficient that such errors are likely to not exactly match in the two approaches. It is a valuable precaution to calibrate the approaches against each other to give an estimate of such small possible offsets that may occur. If each approach uses a different wavelength, then the estimate will be a better one, because then the possible errors that have a similar cyclic relationship to the cyclic intensity-period will certainly not be matched. This precaution will be evident to anybody versed in the related art of heterodyne interferometry.

Depending upon the inclination-angle of illuminating and viewing, the wavelength, width of mark, and microscope-resolution, the primary and secondary images will coalesce as the gap becomes smaller. There is some point at which the secondary fringes lose their distinctness and can no longer be used for a robust and accurate measurement. For an exemplary embodiment that gap will be about 20 microns, but is expected to become smaller in development with greater inclination angle. When the secondary fringes lose their distinctness, then the rapidly shifting fringe-pattern that still occurs in the coalesced images must be relied upon for the measurement. Some of the ambiguity has already been resolved at that point from knowledge that the images are coalesced. However, for measuring of these smaller gaps, it is likely that an extra grating with differently-varying transverse grating-period will be needed to resolve the ambiguities, as discussed earlier. This is not a great disadvantage since there is room in the field of view for more than one such gapping image, as well as for IBBI aligning marks.

It is expected that a larger inclination-angle will increase the separation between the two images, while retaining all the other properties of the patterns. This will retain the separation down to smaller gaps. Thus, the ability to more-easily resolve the ambiguities of the primary image will be retained for smaller gaps. Likewise, the ability to obtain a coarser measurement down to smaller gaps will be retained using only the secondary image. The expected accuracy, from the secondary-image measurement alone, is <50 nm, when two sets of gratings chirped in opposite directions, are placed end to end. The expected accuracy from the primary measurement is <10 nm.

The coarser measurement from the geometric offset of the secondary image alone is a quick measurement useful for giving guidance in collision avoidance when the mask is approaching the substrate preparatory for gapping and aligning. It is expected that the invention will also have applications beyond x-ray lithography for accurately measuring gaps between plates.

In an exemplary embodiment of the invention, each 2-dimensional checkerboard grating is in the form of a narrow stripe, about 10×100 $\mu$m. The shorter dimension, and vector associated with a fixed period of about 2 $\mu$m, are in the plane of incidence. It's longer dimension, and the vector associated with a variable period ranging between about 1 and 4 $\mu$m, lie in the transverse plane, which is perpendicular to mask and substrate planes and to the incident plane. A diode-laser operates at a wavelength of about 0.69 $\mu$m, and launches its beam into single-mode fiber optics which convey the light to combine it with the optical system used for illuminating and imaging the mask-mark. The fringes that are observed in the images generally have periods lying in the range between 7 and 40 $\mu$m.

A linear grating is also included in the mark, for calibration purposes using the IDM approach described in an earlier section. It, the gapping-gratings just described, and the gratings needed for the previously described IBBI overlay aligning method, are also included within the same mark that will be used for aligning and gapping. They will all be in the same field of view of the IBBI optics, and be separately imaged simultaneously on the imaging sensor.

The illumination is either introduced within the imaging microscope through a beam-splitter, or alternatively introduced by a small mirror very close to the optical axis of the viewing path, and directed so as to illuminate the mark on the mask with a collimated beam. The microscope is approximately f/10, with working distance about 11 cm and magnification 12×. In the following, the viewing direction is equated to the illuminating direction, but in practice a small difference in angle is acceptable.

The optics are the same as used in the previously described IBBI system used for aligning mask and substrate to register successive overlays. The optical system uses well known and previously-described techniques.

The mask-mark is illuminated and imaged using the same, or almost the same, path for illuminating and viewing. These combined paths are incident at about 20° from the normal to the mask and substrate surfaces. It is expected that this angle can be advantageously increased. All these values, as well as the following parameters and configurations may be varied depending upon the detailed measurement-requirements.

A nominally 50% duty-cycle grating is used because this suppresses 2nd-order diffractions. However, other duty-cycles may still work as long as the second-order diffractions are not so great that they interfere with the performance. Phase-gratings may also be used instead of absorptive gratings.

The NPG configuration is an exemplary embodiment of the invention. It uses one or more checkerboard gratings as described earlier and illustrated in FIGS. 11A–11C and 13A–13B, with an added linear grating for calibration as earlier described. The NPG configuration has the feature that some of the illuminating light arriving at the mask is initially diffracted into a fan of paths that lie in a plane that is normal to the mask and substrate surfaces, and is transverse to the plane of incidence. This is called the NPG plane. These useful initial diffractions are (t,−1,−1), (t,−1,+1), (r,−1,−1) and (r,−1,+1) paths, of which only the transmissive ones are included in the figures, for the sake of simplicity. Note that there is no strength in the (t,±1,0) or (r,±1,0) diffractions from this checkerboard grating, although they would be strong from a street grating. These strengths can be confirmed by inspecting the symmetries of the respective 2-D gratings, or by subjecting them to a two-dimensional Fourier analysis, as anyone versed in the art of diffraction theory will understand. There are other diffractions as well, but these are the ones that lead to subsequent paths that return into the imaging optics. How these paths to the imaging optics arise will now be described.

FIGS. 11A–11C includes three orthogonal views for the NPG configuration using the checkerboard grating (FIGS. 12A–12C include the additional paths that a street grating would give). FIGS. 11A–11C show the arriving light and the five initial strong zero and first-order transmissively-diffracted paths. Path 1111 indicates the light arriving in the XZ plane, which is the plane of incidence. The incident angle is labeled 1115. The NPG plane lies in the YZ plane, which is also the transverse plane. The incident light meets the grating 110, where it is diffracted. The useful transmissively-diffracted paths, lying in the NPG plane, are drawn with solid lines. These result from the (t,−1,−1), (t,−1,+1) diffractions. The others are drawn in broken lines.

For simplicity, the drawing does not include the varying grating-period in the Y-direction. If the grating-period variation were included, then the angles of the diffractions in the YZ plane would correspondingly vary, depending upon the Y-position of arrival of the light.

Every transmissively-diffracted path has a corresponding reflectively-diffracted path that is its mirrored image in the mask plane. Consequently, there is a similar set of paths reflected upward (positive Z-direction) in the drawings of the XZ and YZ planes. These are the (r,−1,−1) and (r,−1,+1) paths. They head toward the mask-obverse surface. Again, of the reflectively-diffracted paths, only those in the NPG plane will contribute to the final useful paths. They will be the mirror images of the useful transmissive ones drawn solid in FIGS. 11A–11C.

Thus, one can see that there are four initial useful diffractive paths, all lying in a fan in the NPG, or transverse, plane. FIGS. 12A–12C illustrate the larger number of diffractive paths in another exemplary embodiment using the street grating.

FIGS. 13A–13B show two of the orthogonal views for the checkerboard grating. The figures illustrate the subsequent useful reflections from the substrate surface, along paths 1323. These reflected paths are drawn solid. To differentiate them, the paths that gave rise to them are drawn as broken lines. For simplicity, the non-useful initial paths are now ignored.

In FIGS. 13A–13B, the paths 1323 will again meet grating 1310 and be diffracted. The transmissively-diffracted paths 1327 will be the reverse of the initial diffractions; and thus path 1327 will head back parallel to the original arrival path of the illuminating light. Thus, the diffracted angle 1330 will be the same as the incident angle 1115 in FIGS. 11A–11C. These paths will contribute to the primary image of the grating.

There will be an equivalent set of paths, heading in the same direction, that will result from the initially reflectively-diffracted paths of the illuminating light. These were described heretofore, but not included in the figures for simplicity. They initially headed toward the mask obverse surface. They will reflect back toward the mask to, in turn, reflectively-diffract again, back along a path parallel to the arriving path 1111 of FIGS. 11A–11C. Thus, these paths will also be imaged into the primary image of the mask. Since they will have traveled a different distance, traversing the mask instead of the gap, they will interfere with the light that arrived after reflecting from the substrate surface.

The description of the returning paths being exactly parallel to the arriving paths will not be exactly true for a varying grating-period. However, with the variations in the invention, they are close enough to being parallel to enter the acceptance angle of the optics. The lack of parallelism is insufficient to adversely affect the accuracy of the measurements, particularly as the measurements will be directly calibrated anyway, by a built-in system using the same hardware.

If the transverse grating-period is constant, then the interference will be uniform across the image, since the paths are invariant with either X or Y. However, if the grating-period in the Y-direction varies with Y, as in the invention, then the interference will result in fringes in the image. The vector associated with these fringes will be parallel with the Y-direction, as illustrated in FIGS. 14A–14C. The fringe-period in the Y direction will depend upon the rate-of-change of grating-period py in the Y-direction. In some alternative embodiments, the period py in the Y-direction may be varied with X, with a whole new range of possibilities.

It is an important to note that, whereas constant grating-periods give no fringes in the image, varying the grating-period does give fringes in the image, thus allowing an imaging technique to be used for gapping, without scanning, once it has been calibrated. Another important feature is that the grating-period is varied in a direction transverse to the plane of the inclined illumination. This allows the grating-period in the plane of incidence to be designed to give the desired angle of incidence, while the transverse grating-period can be designed with varying period to determine the desired relationship between gap and fringe-phase.

In FIGS. 13A–13B, the diffraction of path 1323 into path 1327 is accompanied by its mirror image diffraction into path 1324, i.e., path 1324 is the reflectively-diffracted equivalent of the transmissively-diffracted path 1327. The path 1324 then reflects from the substrate-surface 1329 into path 1325. If path 1325 reaches the mask-surface outside the grating stripe, then it will transmit through the mask-surface into path 1326, which is parallel to path 1327, and hence also to the arriving path 1111 in FIGS. 11A–11C. Consequently it will then return into the imaging optics to contribute to a secondary image offset in the X-direction from the primary image. It will appear to have originated from beside the stripe in the substrate surface.

The paths in the transverse plane returning after reflection from the mask-obverse might also be expected to transmissively diffract into path 1324. However, as described heretofore, the evidence is that very little light from the mask-obverse reflection is seen in the secondary image. Thus, it appears that the path into the secondary image that includes the mask-obverse reflection is less efficient than that involving the substrate-reflection. This happens naturally in this exemplary embodiment, but loss can be introduced artificially in an alternative embodiment. This could be done by introducing a lossy layer between the mask surface and the grating, to simulate the plating-layer in this embodiment. Masks typically used for x-ray lithography already have such a lossy layer resulting from their method of manufacture and from the desire to be able to repair them in use.

Again, fringes are observed in this secondary image only when the transverse grating-period in the Y-direction is varied. It is also observed that these fringes translate more slowly than those in the primary image when the gap is changed, for reasons described earlier. Lack of exact parallelism of the paths to the secondary image will introduce no problem, for the same reasons as described.

Gap is measured by measuring the phases of the fringe-patterns, relative to a stationary fiducial in the mark, or relative to the phase of another set of fringes. The phase-displacements will have been previously calibrated using an approach described heretofore, so that measurement of the phases will yield the gap. In some cases, there will be ambiguities in the measurements, as already described. Depending upon the details of the gratings, and the range of possible gaps, more than one grating may be necessary to unravel the actual gap from the ambiguities.

An optional but desirable part of an exemplary embodiment is to include an additional grating, identical to the first other than that the transverse grating-period is varied in an equal but opposite manner, so that changes in gap cause adjacent sets of fringes to move in opposite directions. Then, measurement of phase difference between the two sets of fringes will approximately double the accuracy of a phase measurement, with correspondingly greater accuracy in the gap-measurement.

FIGS. 14A–14C illustrate, in enclosures 1445 and 1455, the imaging of two stripes with opposing chirp. Two stripes 1441 and 1442 are closely placed end-to-end. The grating-details are shown in expanded enclosures 1443 and 1444, showing the opposed chirp in the Y-direction but constant grating period px.

Enclosure 1445 shows a typical image of this pair of stripes. Enclosure 1455 shows another typical image after a small change of gap. If change in gap is much less than 1 $\mu$m, then the geometric separation will not perceptibly change, but the fringes will translate in the Y-direction; the fringes in one stripe-image moving in the opposite direction from those of the other stripe-image. The relative phase of the two sets of fringes in the primary image will have changed by much more than those in the secondary image.

The geometric distance, in the X-direction, between the centers of the primary and secondary images (1460 and 1461) yields an unambiguous measurement of the gap within an accuracy of about 1 $\mu$m.

The relative phases of the fringes are measured, using techniques that have already been demonstrated in the previously-mentioned IBBI development. The relative phase-difference (1448–1449) from the primary sets of image fringes, and the corresponding relative phase-difference from the secondary sets of image-fringes (1458–1459), yield two series of possible gap-measurements. Since each series has $2\pi$-phase ambiguities, only measurements that match in the two series can be considered as true measurements. The coarser measurement from the geometric separation of the primary and secondary images can further reduce the ambiguities if necessary.

Another desirable option will include one or more additional gratings with slightly different variation of transverse grating-period. These will each result in another series of ambiguities that only match for the correct measurement. This will give a more positive assurance that the ambiguity has been correctly resolved, and also provide ambiguity resolution at the smaller gaps where the secondary image has coalesced with the primary image, so the slower-moving fringes of the secondary image are no longer available.

When the measurement requires going down to gaps small enough that the fringes associated with the secondary and primary images can no longer be separately distinguished, then the ambiguity-resolving power of the secondary image will be lost; that is beyond the information that the gap is within the range that causes the coalescence. The faster-moving fringes of the remaining image need then to be unambiguously interpreted by having at least one more 2-D grating in the mask with a differently-varying transverse period. However, the invention is expected to lead to unambiguous resolution in this range, from a single 2-D grating (or opposed pair) using discontinuously varying gratings which are expected to more-easily overcome the ambiguity at these small gaps.

Other exemplary embodiments are also part of the invention, and may become preferable in certain circumstances. Some embodiments include the various mixes of NPG and "Littrow" configurations and of checkerboard and street and other two-dimensional gratings, that have not been described. These, with the other two-dimensional gratings, including variations of stepped transverse grating-periods, will provide a great diversity of unique properties having special value depending upon the details of the application. Some of the possible combinations that may have valuable properties are briefly described below.

An alternative exemplary embodiment is the same as previously described except that it uses a street grating instead of a checkerboard, with other details the same. Another exemplary embodiment is the same as previously described except that the constant grating-period in the incident plane is designed so that one of the first-order reflective-diffractions returns back, along the arriving path, to the viewing optics. This is commonly referred to as Littrow configuration. The important first diffractions at the first mask-encounter then take place into fans in two transverse planes, inclined to the vertical by $\pm\theta i$, where $\theta i$ is the angle of incidence.

Another exemplary embodiment combines the street grating embodiment with the Littrow configuration, having the grating-period in the incident plane designed to return some light directly into the arriving path from first encounter with mask. This again has the important first diffractions at the first mask-encounter taking place into fans in two transverse planes, inclined to the vertical by $\pm\theta i$, where $\theta i$ is the angle of incidence.

In any of the above exemplary embodiments, the variation of grating-period need not be uniformly continuous. Since the local intensity is a function of the gap and the local grating-period, then stepwise changes in grating-period will cause step-wise changes of intensity. It will appreciated that the steps can be designed to give a unique intensity pattern for any selected gap. Furthermore, designed variations in the pattern can indicate extent of departure from the selected gap. Careful arrangement of the steps can also be equivalent to including the ambiguity-resolving properties of multiple gratings. The uniform chirp is just one example of pattern-selection to achieve the desired end. The details in the design and use of such stepped gratings will depend upon the other details of the embodiment that is used.

Any of the above embodiments may have the gratings as phase gratings rather than transmission gratings, with similar results. The narrow-stripe form of grating has the advantage of giving a separated secondary image. There may be situations in which a larger area of grating may be even more advantageous.

Although the present invention has been shown and described with respect to several preferred embodiments thereof, various changes, omissions and additions to the form and detail thereof, may be made therein, without departing from the spirit and scope of the invention.

What is claimed is:

1. A gapping apparatus for measuring the gap between first and second plates, comprising:

a gapping mark on a first surface of said first plate including a first array of similar elements in a two-dimensional pattern, having uniform period in a first direction and a non-uniform period in the transverse direction;

a light source for illuminating a second surface of said second plate through said gapping mark on said first plate to produce a first interference pattern having a first period and a first spatial phase, and a second interference pattern having a second period and a second spatial phase;

illuminating and viewing optics configured so that the incident and viewing angles are inclined from the normal, bearing a correct relationship to said gapping mark such that said interference patterns will be imaged by the viewing optics;

a detector configured as an image-sensor to measure said first and second periods and first and second spatial phases of said interference patterns, and thus to measure the gap between said first and second surfaces and to determine the difference between said measured gap and a predetermined value; and a position adjuster for adjusting the relative position of said first and second plates until said detector detects that said gap is within an acceptable tolerance from said predetermined value.

2. The gapping apparatus of claim 1, wherein said first array is formed as a two-dimensional checkerboard grating having uniform period in said first direction and a non-uniform period in said transverse direction.

3. The gapping apparatus of claim 1, wherein said first array is formed as a two-dimensional street grating having uniform period in said first direction and a non-uniform period in said transverse direction.

4. The gapping apparatus of claim 1, wherein said first array is formed as a two-dimensional array of two-dimensional gratings having uniform period in said first direction and different non-uniform periods in said transverse direction.

5. The gapping apparatus of claim 1, wherein under certain conditions said second interference pattern merges into said first interference pattern so that only a single third interference pattern is identifiable having a third period and a third spatial phase.

6. The gapping apparatus of claim 5, wherein said detector is configured as an image-sensor to measure the third period and the third spatial phase of said third interference pattern, and to measure the gap between said first and second surfaces and to determine the difference between said measured gap and a predetermined value.

7. The gapping apparatus of claim 1, wherein said gapping mark comprises a second array of similar elements in a two-dimensional pattern, having said uniform period in said first direction, with symmetry in said transverse direction opposite to the symmetry of said first non-uniform period, such that fourth and fifth interference patterns are formed with the fourth interference pattern having the same period as the first interference pattern, and the fifth interference pattern having the same period as the second interference pattern, and the fourth interference pattern having a spatial phase that changes in the opposite sense to the spatial phase of the first interference pattern when the gap changes, and the fifth interference pattern having a spatial phase that changes in the opposite sense to the spatial phase of the second interference pattern when the gap changes.

8. The gapping apparatus of claim 1, wherein said gapping mark comprises a first and second array of similar elements in a two-dimensional pattern, both arrays having said uniform period in said first direction, with different non-uniform grating-periods in said transverse direction, such that fourth and fifth interference patterns are formed with the said fourth interference pattern having a different period to the said first interference pattern, and the said fifth interference pattern having a different period to the said second interference pattern, and the said fourth interference pattern having a spatial phase that changes in the same sense as the spatial phase of the said first interference pattern but at a different rate when the gap changes, and the said fifth interference pattern having a spatial phase that changes in the same sense as the spatial phase of the said second interference pattern but at a different rate when the gap changes.

9. The gapping apparatus of claim 1, wherein said gapping mark comprises indicia on said first surface of said first plate that are configured to provide a reference for measuring said first and second periods and said first and second spatial phases of said interference patterns.

10. The gapping apparatus of claim 1, wherein said gapping mark comprises one or more additional arrays of similar elements in a two-dimensional pattern having uniform period in said first direction and different non-uniform periods in said transverse direction, such that additional interference patterns are formed in which the phases change with said gap at a different rate from that of the first interference pattern, and thus resolve ambiguities of measurement that may arise.

11. The gapping apparatus of claim 1, wherein said gapping mark comprises a first array configured as a narrow first stripe with its longer dimension in the direction of the said transverse non-uniform period, to allow better separation of said first and second interference patterns.

12. The gapping apparatus of claim 1, wherein said first and second plates comprise a lithographic mask and a semiconductor substrate.

13. The gapping apparatus of claim 1, wherein said detector includes controlled spatial filtering for inhibiting the transmission of unwanted light-energy to said detector.

14. The gapping apparatus of claim 1, wherein said gapping mark comprises an additional array containing a linear grating with uniform period to permit absolute calibration using the quasi-Michelson method.

15. The gapping apparatus of claim 1 further comprising:

a blank area provided on said first plate to allow the Fabry-Perot technique for gap-measuring in scanning mode, using coherent illumination perpendicular to the surfaces of first and second plates; and means for adjusting the illuminating and viewing optics to permit illumination and viewing perpendicular to the surfaces of said first and second plates.

16. A gapping apparatus for measuring the gap between first and second plates, comprising:

a gapping mark on a face of said first plate including an array of similar elements in a two-dimensional pattern, having uniform period in a first direction and a non-uniform period in the transverse direction;

illuminating and viewing optics configured so that the incident and viewing angles are inclined from the normal, bearing a correct relationship to said gapping mark such that interference patterns will be imaged by the viewing optics;

a detector configured as an image-sensor to measure said first and second periods and first and second phases of said interference patterns, and thus to measure the gap between the said first and second surfaces and to determine the difference between said measured gap and a predetermined value; and a position adjuster for adjusting the relative position of said first and second plates until said detector detects that said gap is within an acceptable tolerance from the said predetermined value.

17. A method of measuring the gap between first and second plates, comprising:

providing a gapping mark on a first surface of said first plate including a first array of similar elements in a two-dimensional pattern, having uniform period in a first direction and a non-uniform period in the transverse direction;

illuminating a second surface of said second plate through said gapping mark on said first plate to produce a first interference pattern having a first period and a first spatial phase, and to produce a second interference pattern having a second period and a second spatial phase;

measuring said first and second periods and first and second phases of said interference patterns, and thus the gap between said first and second surfaces in order to determine the difference between said measured gap and a predetermined value; and adjusting the relative position of said first and second plates until said gap is within an acceptable tolerance from said predetermined value.

* * * * *